(12) United States Patent
Onuki et al.

(10) Patent No.: US 8,803,553 B2
(45) Date of Patent: *Aug. 12, 2014

(54) DIFFERENTIAL TRANSMISSION CIRCUIT

(71) Applicant: Canon Kabushiki Kaisha, Tokyo (JP)

(72) Inventors: Kenji Onuki, Tokyo (JP); Hideyuki Rengakuji, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/651,514

(22) Filed: Oct. 15, 2012

(65) Prior Publication Data

US 2013/0038386 A1  Feb. 14, 2013

Related U.S. Application Data

(63) Continuation of application No. 13/000,609, filed as application No. PCT/JP2009/061537 on Jun. 16, 2009, now Pat. No. 8,310,276.

(30) Foreign Application Priority Data

Jun. 27, 2008 (JP) ................................. 2008-169332
Aug. 7, 2008 (JP) ................................. 2008-204773

(51) Int. Cl.
  *H03K 19/0175* (2006.01)
  *H04B 1/38* (2006.01)
(52) U.S. Cl.
  USPC ............... 326/86; 326/81; 375/219; 375/229; 375/354

(58) Field of Classification Search
  USPC ........ 326/81–83, 86; 375/137, 219, 229, 232, 375/257, 354; 710/105, 106, 313
  See application file for complete search history.

(56) References Cited

U.S. PATENT DOCUMENTS

| | | | |
|---|---|---|---|
| 6,615,301 B1 | 9/2003 | Lee et al. | |
| 6,697,040 B2 | 2/2004 | Imajo et al. | |
| 6,825,739 B2 | 11/2004 | Fujimoto | |
| 7,500,033 B2 | 3/2009 | Teil et al. | |
| 7,639,745 B2 | 12/2009 | Bonelli et al. | |
| 7,656,981 B2 * | 2/2010 | Stojanovic et al. | 375/355 |
| 7,683,691 B2 | 3/2010 | Kumata | |
| 7,825,695 B2 * | 11/2010 | Whetsel | 326/86 |
| 2008/0195792 A1 | 8/2008 | Teil et al. | |

FOREIGN PATENT DOCUMENTS

| | | |
|---|---|---|
| JP | 11-186674 A | 7/1999 |
| JP | 2003-249904 A | 9/2003 |
| JP | 2007-149805 A | 6/2007 |
| JP | 2008-84830 A | 4/2008 |
| JP | 2008-131538 A | 6/2008 |

* cited by examiner

Primary Examiner — Vibol Tan
(74) Attorney, Agent, or Firm — Carter, DeLuca, Farrell & Schmidt, LLP

(57) ABSTRACT

A differential transmission circuit comprises a sending unit that generates a pair of differential signals from an input signal, and sends the differential signals; a receiver that receives the differential signals sent by the sending unit; and a transmission path that transmits the differential signals from the sending unit to the receiver, wherein the sending unit has a selector that selects one of the input signal and a signal obtained by inverting a polarity of the input signal, and generates the differential signals from the signal selected by the selector.

2 Claims, 18 Drawing Sheets

F I G. 8
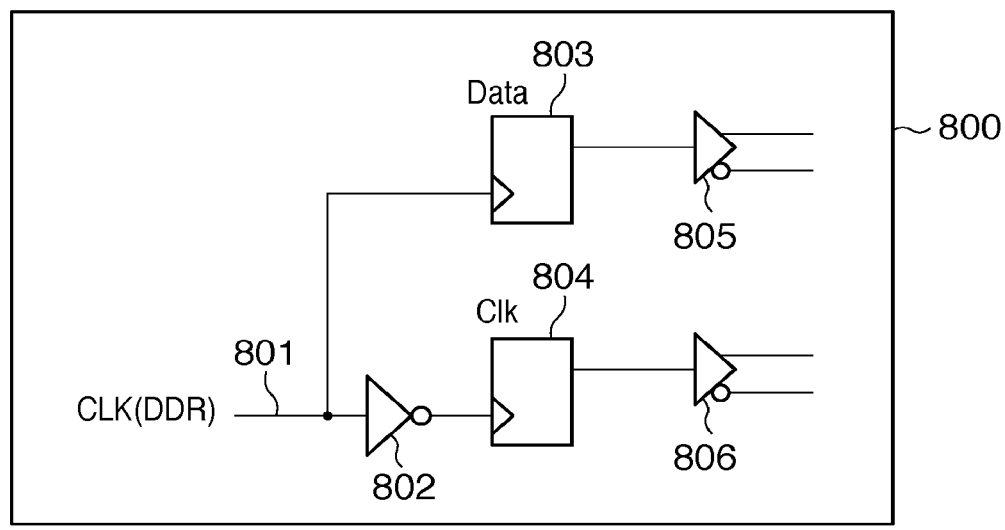

F I G. 21
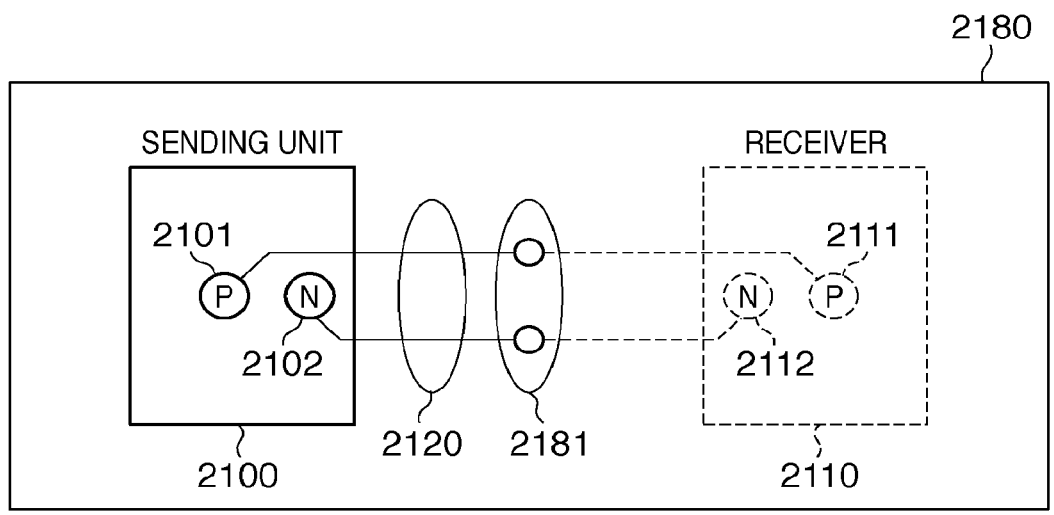
F I G. 22
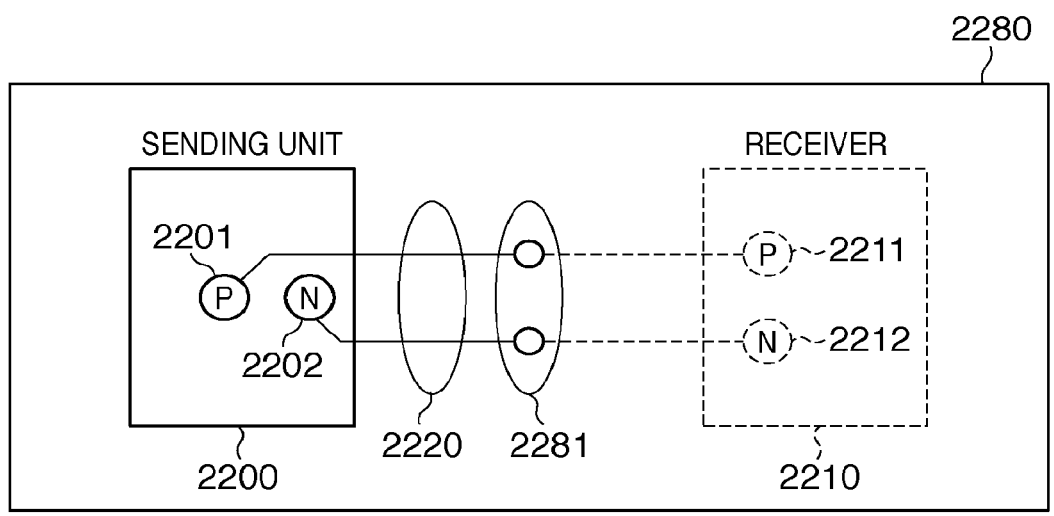

DIFFERENTIAL TRANSMISSION CIRCUIT

CROSS REFERENCE TO RELATED APPLICATIONS

This application is a continuation of U.S. patent application Ser. No. 13/000,609 filed Dec. 21, 2010, which claims the benefit of and priority to Japanese Patent Application No. 2008-169332 filed Jun. 27, 2008 and Japanese Patent Application No. 2008-204773 filed Aug. 7, 2008, each of which are hereby incorporated by reference herein in their entirety.

BACKGROUND OF THE INVENTION

1. Field of the Invention

The present invention relates to a circuit configuration for transmitting differential signals.

2. Description of the Related Art

The need to transmit high frequency digital signals has arisen with the digitization and increasing speed of electronic devices. Radiated noise not only from external interfaces and transmission cables between boards in a device but also from wiring between IC chips on the same board has thus become a significant problem.

A differential transmission system is widely used as a countermeasure to this radiated noise, although with a differential transmission system, the wirings of transmission paths intersect due to the terminal arrangement of the IC chips, resulting in distortion of characteristic impedance. If appropriate wiring that does not intersect is to be performed, IC chips having the same function but different terminal arrangements will thus be required.

In Japanese Patent Laid-Open No. 2007-149805, the configuration of a printed wiring board that maintains isometricity and reduces distortion of characteristic impedance even in the case where wirings for performing differential transmission intersect is disclosed.

In Japanese Patent Laid-Open No. 2003-249904, an integrated circuit having a shield effect that protects transmission signals from electromagnetic interference by enclosing connection balls with the power supply and GND is disclosed.

In Japanese Patent Laid-Open No. 11-186674, a technique that prevents loss of signal quality and radiation of noise by arranging a pair of data transmission circuits axisymmetrically on the board of a differential transmission circuit is disclosed.

DISCLOSURE OF INVENTION

FIG. 14 shows a configuration of a conventional differential transmission circuit board.

In FIG. 14, reference numeral 1400 denotes a sending unit that sends a pair of differential signals. Reference numeral 1410 denotes a receiver that receives the differential signals sent by the sending unit 1400. The sending unit 1400 and the receiver 1410 are respectively provided with BGA (Ball Grid Array) P (positive logic) terminals 1401 and 1411 and N (negative logic) terminals 1402 and 1412. Reference numeral 1420 denotes transmission paths for transferring the differential signals. In the case where the sending unit 1400 and the receiver 1410 are implemented on the same surface of a board 1480, the transmission paths 1420 are isometric and parallel.

However, in the case where a sending unit 1500 and a receiver 1510 are implemented on different surfaces, such as the front and the back, of a board 1580 as shown in FIG. 15, the positions of a P terminal 1512 and an N terminal 1511 of the receiver 1510 are inverted with respect to a P terminal 1501 and an N terminal 1502 of the sending unit 1500. Thus, transmission paths 1520 intersect, causing mismatching of characteristic impedance and loss of signal quality. The dotted lines in FIG. 15 show that the receiver 1510 is implemented on the surface on the opposite side of the board 1580 to the sending unit 1500.

The appearance of a circuit board when the sending unit and the receiver are implemented on the same surface of the board in a differential transmission system for transmitting a plurality of signals is shown in FIG. 16.

In FIG. 16, reference numeral 1600 denotes a sending unit that sends differential signals. Reference numeral 1610 denotes a receiver that receives the differential signals sent by the sending unit 1600. Reference numeral 1620 denotes transmission paths for transferring the differential signals. Reference numerals 1601 and 1602 denote input signals for generating the differential signals. Reference numerals 1603 and 1604 denote flip-flop circuits for respectively holding the Data1 and Data2 input signals 1601 and 1602. Reference numerals 1605 and 1606 denote buffers for respectively generating the differential signals from the input signals 1601 and 1602. Reference numerals 1615 and 1616 denote buffers that receive the differential signals sent via the transmission paths 1620 and output differences. Reference numerals 1611 and 1612 denote output signals respectively generated by the buffers 1615 and 1616. Reference numerals 1613 and 1614 denote flip-flop circuits for respectively holding the output signals 1611 and 1612. The differential signals are respectively generated by the buffers 1605 and 1606 from the input signals 1601 and 1602, and sent to the receiver 1610 via the transmission paths 1620. The flip-flop circuits 1613 and 1614 hold the output signals 1611 and 1612 generated by the buffers 1615 and 1616 from the received differential signals.

The appearance of a circuit board when the sending unit and the receiver are implemented on different surfaces of the board is shown in FIG. 17.

In FIG. 17, reference numeral 1780 denotes a circuit board, and 1781 denotes via holes. In this case, the signals get switched around in the sending unit 1700 and the receiver 1710 as shown in FIG. 17 when transmission paths 1720 are kept isometric and parallel. If the circuit board is configured so that the signals are not switched around, transmission paths 1820 intersect as shown in FIG. 18, making it difficult to control the characteristic impedance of the transmission paths.

Here, with the above-mentioned Japanese Patent Laid-Open No. 2007-149805, when a plurality of pairs of differential signals are provided in the case where the input unit and the output unit are implemented on different surfaces of the board, the wirings of the transmission paths for the signal pairs intersect, and the above-mentioned problems cannot be addressed.

With the above-mentioned Japanese Patent Laid-Open No. 2003-249904, the connection balls are arranged symmetrically on the board with respect to a perpendicular surface, but when the sending unit and the receiver are implemented on different surfaces of the board in differential transmission, the transmission paths intersect and characteristic impedance will be mismatched. Thus, the problem of signal quality loss cannot be solved.

Further, loss of signal quality due to distortion of characteristic impedance when wires intersect cannot be addressed simply by arranging the transmission paths for differential signals axisymmetrically as in Japanese Patent Laid-Open No. 11-186674.

The present invention has been made in consideration of the above-mentioned problems, and realizes a circuit configuration that enables a sending unit and a receiver to be implemented on different surfaces of a board with IC chips having the same terminal arrangement, while keeping transmission paths in a differential transmission system parallel and isometric.

In order to solve the aforementioned problems, the present invention provides a differential transmission circuit comprising: a sending unit that generates a pair of differential signals from an input signal, and sends the differential signals; a receiver that receives the differential signals sent by the sending unit; and a transmission path that transmits the differential signals from the sending unit to the receiver, wherein the sending unit has a selector that selects one of the input signal and a signal obtained by inverting a polarity of the input signal, and generates the differential signals from the signal selected by the selector.

The present invention also provides a differential transmission circuit comprising: a sending unit that generates a pair of differential signals from an input signal, and sends the differential signals; a receiver that receives the differential signals sent by the sending unit; and a transmission path that transmits the differential signals from the sending unit to the receiver, wherein the receiver has a selector that selects one of a difference signal obtained by taking a difference of the differential signals and a signal obtained by inverting a polarity of the difference signal, and generates an output signal from the signal selected by the selector.

The present invention also provides a differential transmission circuit comprising: a sending unit that generates a pair of differential signals from an input signal, and sends the differential signals from a P terminal and an N terminal; a receiver that receives, at a P terminal and an N terminal, the differential signals sent by the sending unit, and generates an output signal; a first transmission path that transfers a differential signal from the P terminal of the sending unit to the P terminal of the receiver; and a second transmission path that transfers a differential signal from the N terminal of the sending unit to the N terminal of the receiver, wherein the P terminal and the N terminal of at least one of the sending unit and the receiver are lined up parallel to the first transmission path and the second transmission path.

According to the present invention, a sending unit and a receiver can be implemented on different surfaces of a board with IC chips having the same terminal arrangement, while keeping transmission paths in a differential transmission system parallel and isometric.

Further features of the present invention will become apparent from the following description of exemplary embodiments (with reference to the attached drawings).

BRIEF DESCRIPTION OF DRAWINGS

FIG. 8 shows a configuration of a sending unit of a differential transmission circuit.

FIG. 21 shows a board configuration in the case where a differential transmission circuit of the sixth embodiment according to the present invention is implemented on different surfaces of a board, and P terminals and N terminals are lined up in different directions, parallel to transmission paths.

FIG. 22 shows a board configuration in the case where a differential transmission circuit of the sixth embodiment according to the present invention is implemented on different surfaces of a board, and P terminals and N terminals are lined up in different directions so as to be orthogonal to transmission paths.

DESCRIPTION OF THE EMBODIMENTS

Embodiments for implementing the present invention will now be described in detail with reference to the accompanying drawings.

Note that the embodiments to be described hereinafter are merely examples for realizing the present invention, and should be appropriately modified or changed depending on the configuration of the apparatus to which the present invention is applied and various conditions. Moreover, the present invention is not limited to the following embodiments.

First Embodiment

Figure 1:
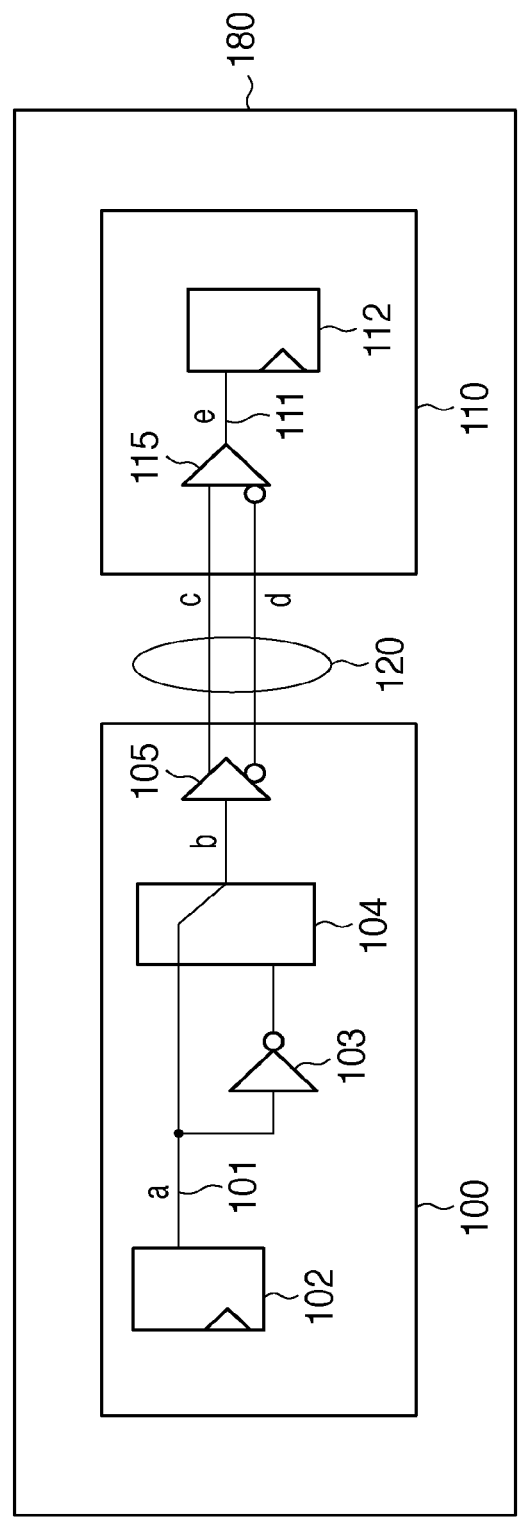
FIG. 1 shows a board configuration in the case where a differential transmission circuit of a first embodiment according to the present invention is implemented on the same surface of a board.

FIG. 1 shows a configuration of a differential transmission circuit board of a first embodiment according to the present invention.

In FIG. 1, reference numeral 100 denotes a sending unit that sends a pair of differential signals, and 110 denotes a receiver that receives the differential signals sent by the sending unit 100. Reference numeral 120 denotes transmission paths for transferring the differential signals. Reference numeral 101 denotes an input signal for generating the differential signals, and 102 denotes a flip-flop circuit for holding the input signal 101. Reference numeral 103 denotes an inverter for inverting the polarity of the input signal 101, and 104 denotes a selector that selects one of the input signal 101 and the signal from the inverter 103. Reference numeral 105 denotes a buffer that generates the differential signals from the signal selected by the selector 104, and 115 denotes a buffer that receives the differential signals generated by the buffer 105 and sent via the transmission paths 120, and outputs a difference (difference signal). Reference numeral 112 denotes a flip-flop circuit for holding an output signal 111 generated by the buffer 115. Reference numeral 180 denotes a circuit board.

Figure 3:
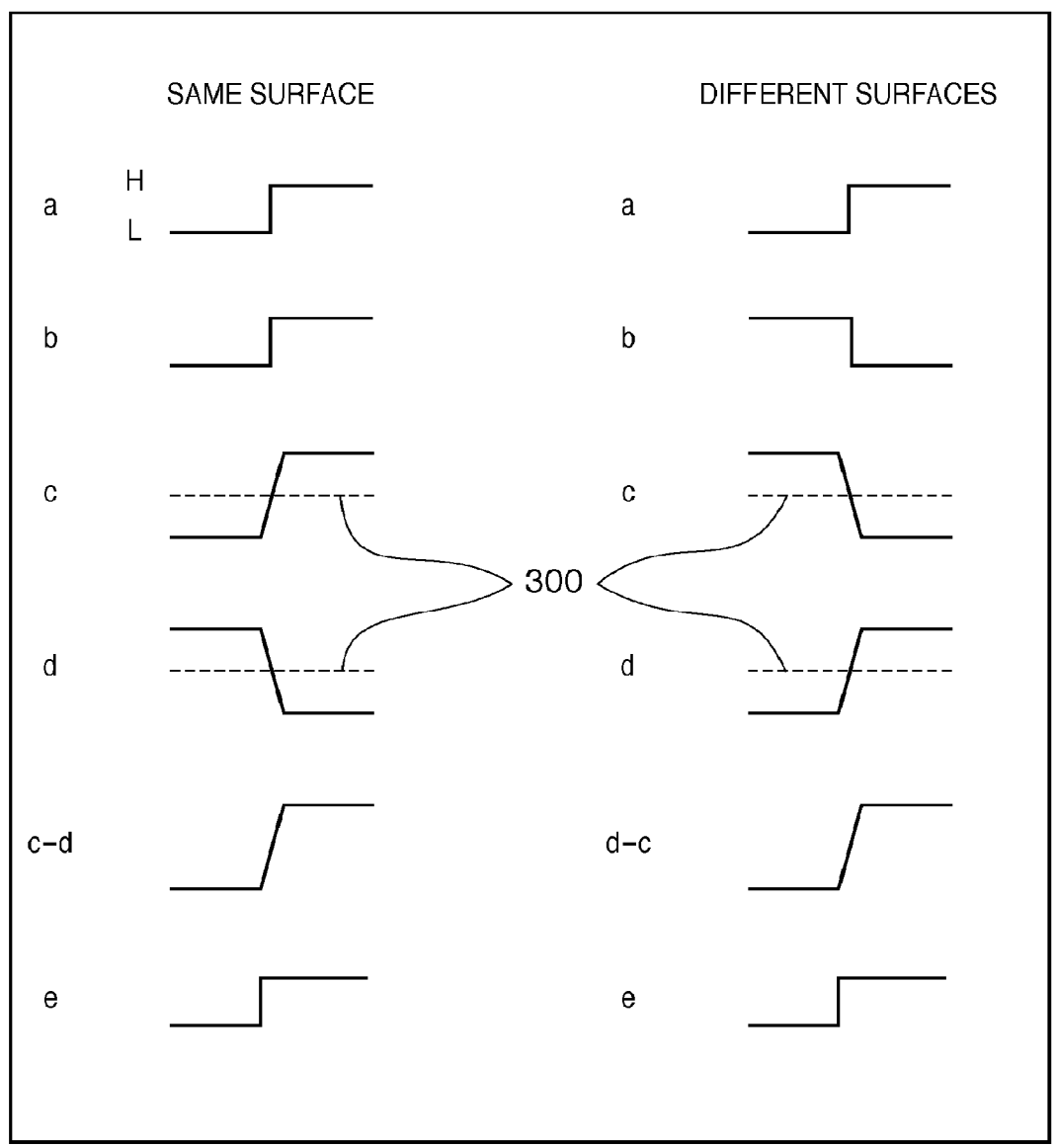
FIG. 3 shows waveforms of signals up until an output signal is obtained in a differential transmission circuit of the first embodiment.

The waveforms of the signals up until the output signal 111 is obtained are shown in FIG. 3. In FIG. 3, a, b, c, d and e show the signals on the wirings in FIG. 1. In FIG. 3, H and L respectively show the high level and low level of the signals. The dotted line 300 is a common mode voltage of the differential signals.

In the case where the sending unit 100 and the receiver 110 are implemented on the same surface of the board, the transmission paths 120 are isometric and parallel. In this case, the selector 104 selects the input signal 101 from the flip-flop circuit 102. Differential signals generated by the buffer 105 from the signal selected by the selector 104 are sent from the sending unit 100 to the receiver 110 via the transmission paths 120. The output signal 111 generated by the buffer 115 from the received differential signals is held in the flip-flop circuit 112. Assuming that the input signal 101 was a signal with a waveform such as the signal a, the signal b selected by the selector 104 will also have the same waveform. The differential signals generated by the buffer 105 will be respectively like the signals c and d, and the output signal 111 generated in the buffer 115 from the difference c−d will have a waveform such as the signal e.

Figure 2:
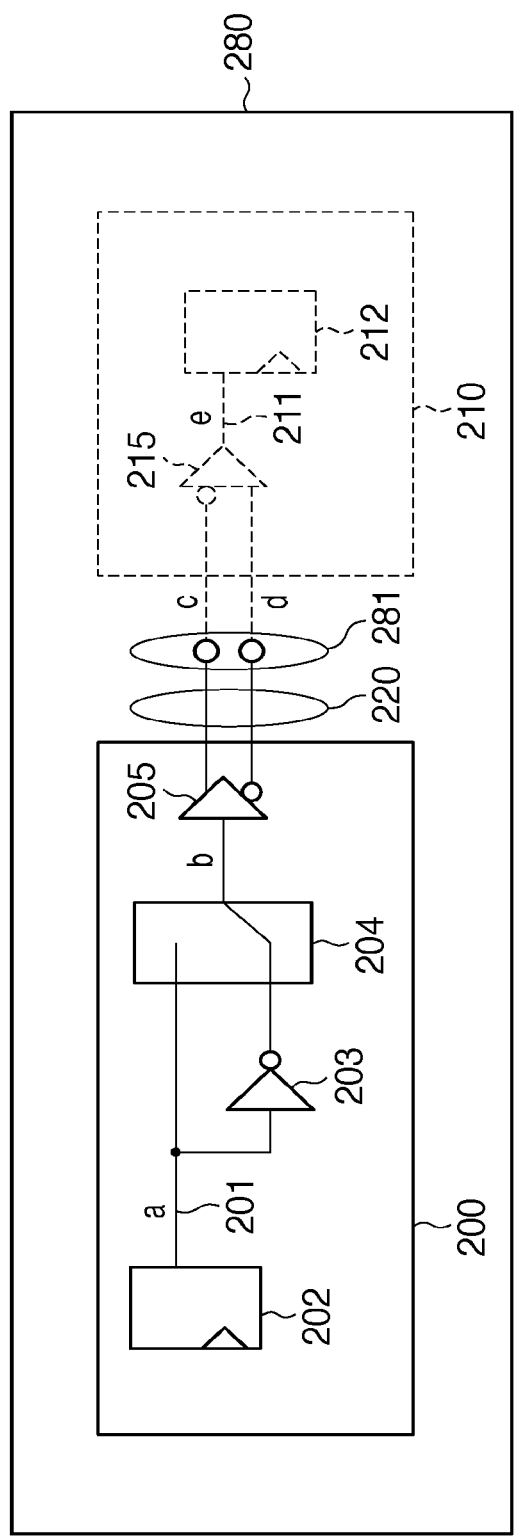
FIG. 2 shows a board configuration in the case where a differential transmission circuit of the first embodiment according to the present invention is implemented on different surfaces of a board.

The appearance of a circuit board when the sending unit and the receiver are implemented on different surfaces of the board is shown in FIG. 2.

In FIG. 2, reference numeral 280 denotes a circuit board, and 281 denotes via holes. The polarity of a buffer 215 is switched in order to keep transmission paths 220 parallel and isometric. In this case, a selector 204 selects the signal obtained by inverting the polarity of an input signal 201 from a flip-flop circuit 202 in an inverter 203. Differential signals generated by the buffer 205 from the signal selected by the selector 204 are sent from the sending unit 200 to a receiver 210 via the transmission paths 220. An output signal 211 generated by the buffer 215 from the received differential signals is held in a flip-flop circuit 212. Assuming that the input signal 201 was a signal with a waveform such as the signal a, the signal b selected by the selector 204 will have a waveform inverted by the inverter 203. The differential signals generated by the buffer 205 will be respectively like the signals c and d, and the output signal 211 generated in the buffer 215 from the difference d−c will have a waveform such as the signal e. The same output signal as when the sending unit and the receiver are implemented on the same surface is thus obtained.

According to the present embodiment, a differential transmission circuit that is compatible in the case where the sending unit and the receiver are implemented either on the same surface or on different surfaces of a board with IC chips having the same terminal arrangement can be realized when transmitting a signal using a differential transmission system. This differential transmission circuit is also compatible with board area reduction and device miniaturization.

Second Embodiment

Figure 4:
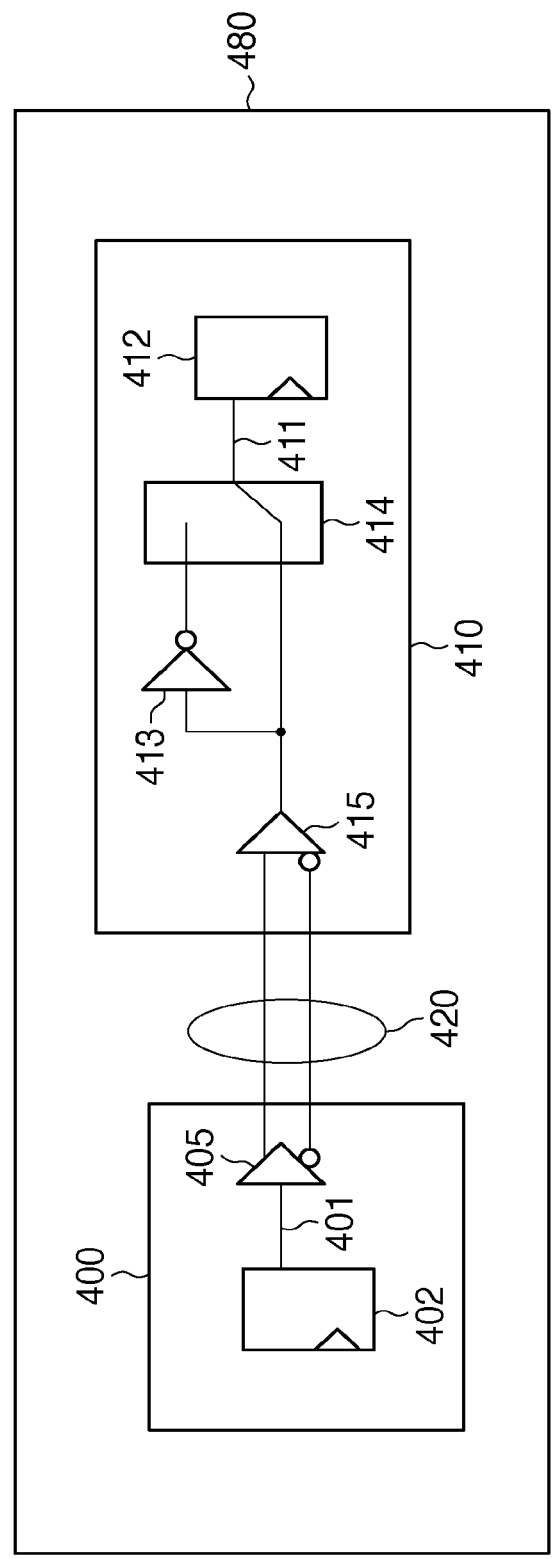
FIG. 4 shows a board configuration in the case where a differential transmission circuit of a second embodiment is implemented on the same surface of a board.

FIG. 4 shows a configuration of a differential transmission circuit board of a second embodiment.

In FIG. 4, reference numeral 400 denotes a sending unit that sends differential signals, and 410 denotes a receiver that receives the differential signals sent by the sending unit 400. Reference numeral 420 denotes transmission paths for transferring the differential signals. Reference numeral 401 denotes an input signal for generating the differential signals, and 402 denotes a flip-flop circuit for holding the input signal 401. Reference numeral 405 denotes a buffer for generating the differential signals from the input signal 401, and 415 denotes a buffer that receives the differential signals generated by the buffer 405 and sent via the transmission paths 420, and outputs a difference (difference signal). Reference numeral 413 denotes an inverter for inverting the polarity of the signal output by the buffer 415, and 414 denotes a selector that selects one of the signal from the buffer 415 and the signal from the inverter 413. Reference numeral 412 denotes a flip-flop circuit for holding an output signal 411 selected by the selector 414. Reference numeral 480 denotes a circuit board.

In the case where the sending unit 400 and the receiver 410 are implemented on the same surface of the board, the differential signals are generated from the input signal 401 and sent from the sending unit 400 to the receiver 410 via the transmission paths 420. The selector 414 selects the signal generated by the buffer 415 from the received differential signals, and the selected signal is held in the flip-flop circuit 412.

Figure 5:
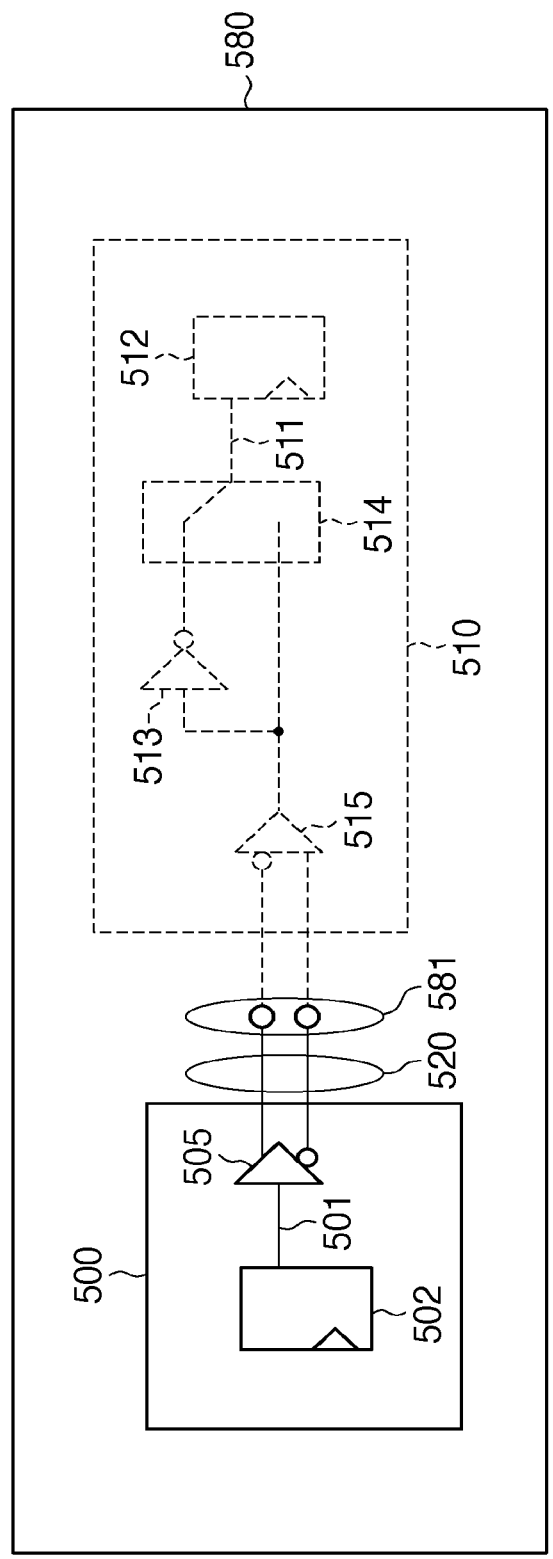
FIG. 5 shows a board configuration in the case where a differential transmission circuit of the second embodiment is implemented on different surfaces of a board.

The appearance of a circuit board when the sending unit and the receiver are implemented on different surfaces of the board is shown in FIG. 5.

In FIG. 5, reference numeral 580 denotes a circuit board, and 581 denotes via holes. The polarity of a buffer 515 is switched in order to keep transmission paths 520 parallel and isometric. In this case, as a result of a selector 514 selecting a signal generated by the buffer 515 from received differential signals and polarity inverted in an inverter 513, the same output signal as when the sending unit and the receiver are implemented on the same surface is obtained and held in a flip-flop circuit 512.

According to the present embodiment, a differential transmission circuit that is compatible in the case where the sending unit and the receiver are implemented either on the same surface or on different surfaces of a board with IC chips having the same terminal arrangement can be realized when transmitting a signal using a differential transmission system. This differential transmission circuit is also compatible with board area reduction and device miniaturization.

Third Embodiment

Figure 6:
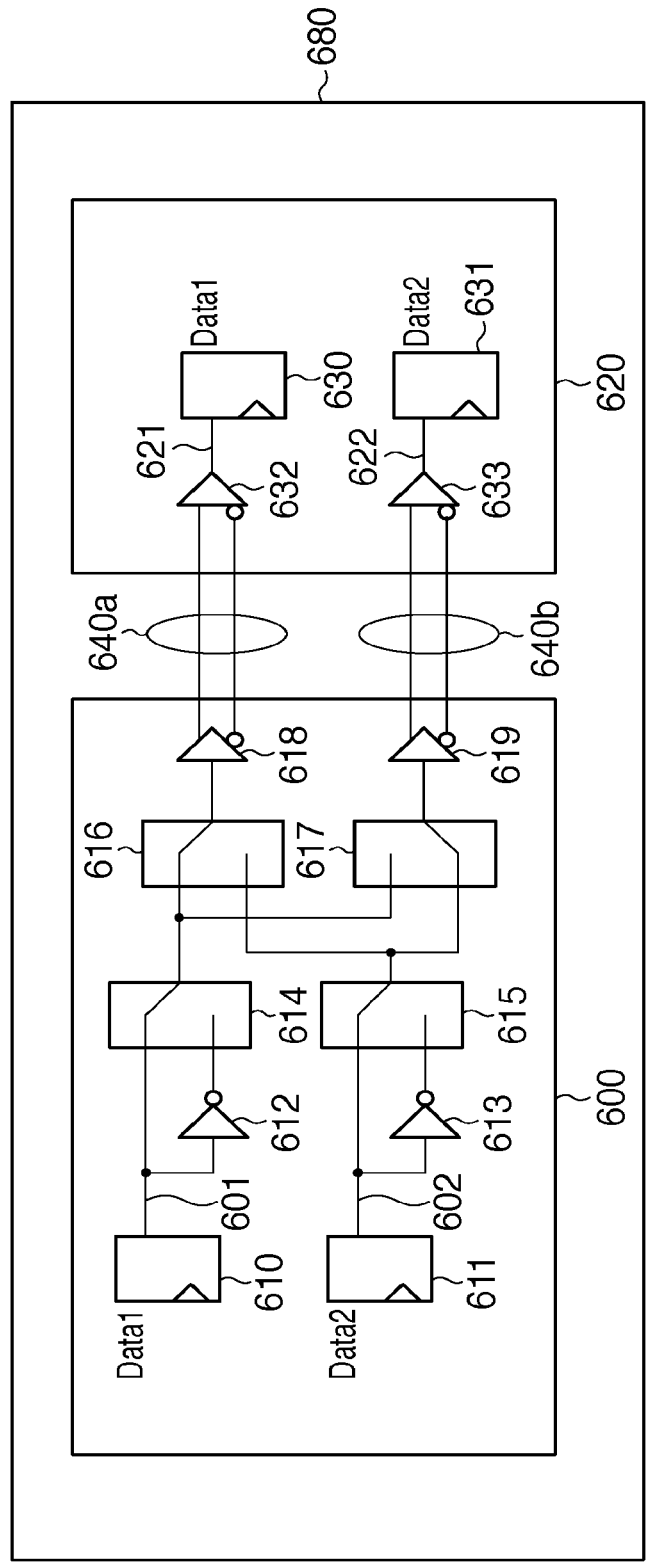
FIG. 6 shows a board configuration in the case where a differential transmission circuit of a third embodiment is implemented on the same surface of a board.

FIG. 6 shows a configuration of a differential transmission circuit board of a third embodiment.

In FIG. 6, reference numeral 600 denotes a sending unit that sends differential signals. Reference numeral 620 denotes a receiver that receives the differential signals sent by the sending unit 600. Reference numerals 640a and 640b denote transmission paths (first transmission paths, second transmission paths) for transferring the differential signals. Reference numerals 601 and 602 denote input signals (first input signal, second input signal) for generating the differential signals (first differential signals, second differential signals). Reference numerals 610 and 611 denote flip-flop circuits for respectively holding the Data1 and Data2 input signals 601 and 602. Reference numerals 612 and 613 denote inverters for inverting the respective polarities of the input signals 601 and 602. Reference numeral 614 denotes a selector (first selector) that selects one of the input signal 601 and the signal from the inverter 612. Reference numeral 615 denotes a selector (second selector) that selects one of the input signal 602 and the signal from the inverter 613. Reference numerals 616 and 617 denote selectors (third selector, fourth selector) that respectively select one of the signal from the selector 614 and the signal from the selector 615 as a third signal and a fourth signal. Reference numerals 618 and 619 denote buffers for respectively generating differential signals from the signals selected by the selectors 616 and 617. Reference numerals 632 and 633 denote buffers for respectively receiving the signals generated by the buffers 618 and 619 and sent via the transmission paths 640a and 640b, and outputting differences (difference signals). Reference numerals 621 and 622 respectively denote output signals (first output signal, second output signal) generated by the buffers 632 and 633. Reference numerals 630 and 631 denote flip-flop circuits for respectively holding the output signals 621 and 622.

In the case where the sending unit 600 and the receiver 620 are implemented on the same surface of the board, the selectors 614 and 615 respectively select the input signals 601 and 602. The selector 616 selects the signal from the selector 614, and the selector 617 selects the signal from the selector 615. Differential signals generated by the buffers 618 and 619 from the selected signals are respectively sent from the sending unit 600 to the receiver 620 via the transmission paths 640a and 640b. The output signals generated by the buffers 632 and 633 from the received differential signals are respectively held in the flip-flop circuits 630 and 631.

Figure 7:
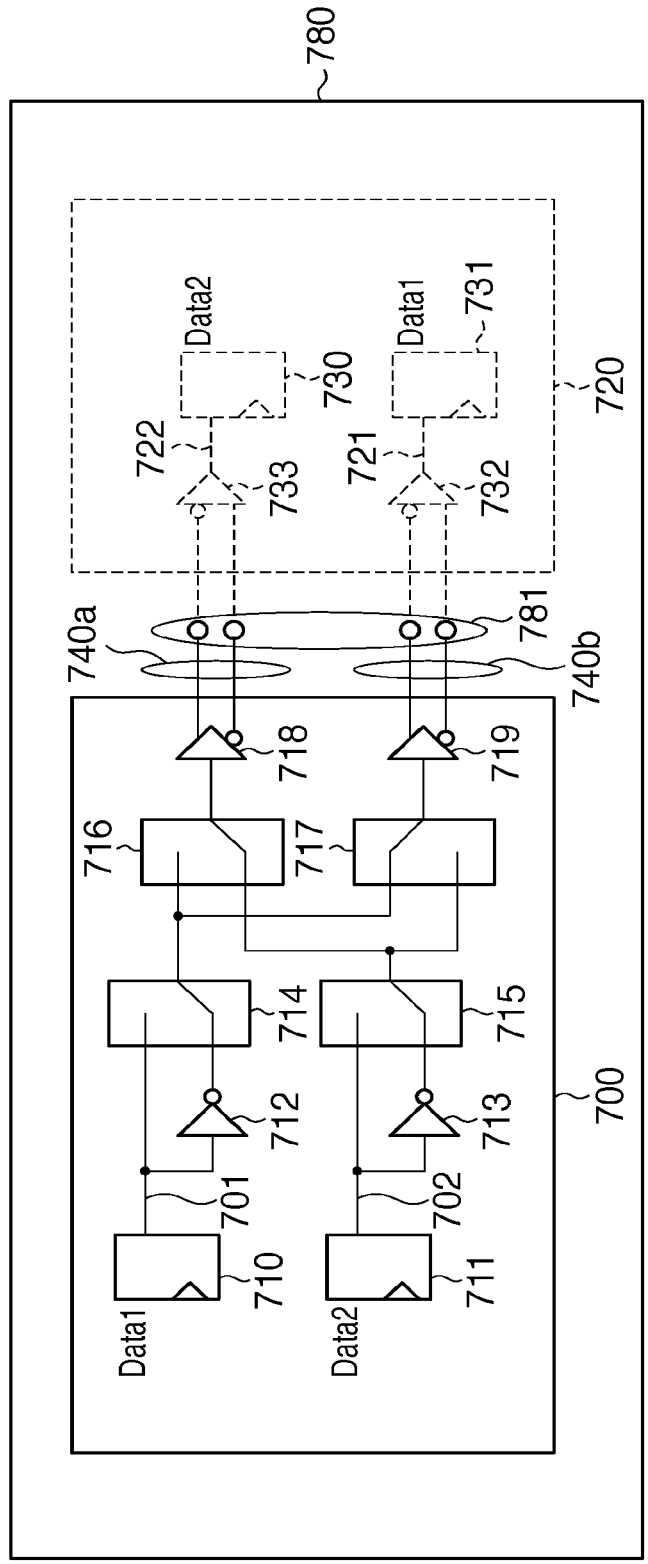
FIG. 7 shows a board configuration in the case where a differential transmission circuit of the third embodiment is implemented on different surfaces of a board.

FIG. 7 shows the appearance of a circuit board when the sending unit and the receiver are implemented on different surfaces of the board.

In FIG. 7, reference numeral 780 denotes a circuit board, and 781 denotes via holes. The polarities of buffers 732 and 733 are switched in order to keep both transmission paths 740a and 740b parallel and isometric. In this case, selectors 714 and 715 respectively select signals obtained by inverting the polarities of input signals 701 and 702 in inverters 712 and 713. The Data1 and Data2 input signals are then switched as a result of a selector 716 selecting the signal from the selector 715 and a selector 717 selecting the signal from the selector 714. Differential signals respectively generated by buffers 718 and 719 from the signals selected by the selectors 716 and 717 are sent to a receiver 720 via the transmission paths 740a and 740b. Output signals 721 and 722 the same as when the sending unit and the receiver are implemented on the same surface are obtained by the buffers 732 and 733 from the received differential signals, and respectively held in flip-flop circuits 731 and 730. Note that while the case where two signals are transmitted has been described, the present invention is also applicable in the case where three or more signals are transmitted.

According to the present embodiment, a differential transmission circuit that is compatible in the case where the sending unit and the receiver are implemented either on the same surface or on different surfaces of a board with IC chips having the same terminal arrangement can be realized when transmitting a plurality of signals using a differential transmission system. This differential transmission circuit is also compatible with board area reduction and device miniaturization.

Fourth Embodiment

With differential transmission for transmitting a plurality of signals, a mechanism such as shown in FIG. 8, for example, for adjusting a clock that clocks an upstream flip-flop is required in the sending unit in order to synchronize the output timing, in the case where one of the plurality of input signals is a clock signal.

In FIG. 8, reference numeral 800 denotes the configuration of a sending unit in a differential transmission circuit. Reference numeral 801 denotes a DDR (Double Data Rate) clock. Reference numeral 802 denotes an inverter that inverts the clock 801. Reference numerals 803 and 804 denote flip-flop circuits for respectively holding Data and Clk input signals for differential transmission. Reference numerals 805 and 806 denote buffers for respectively generating differential signals from the signals from the flip-flop circuits 803 and 804.

Figure 9:
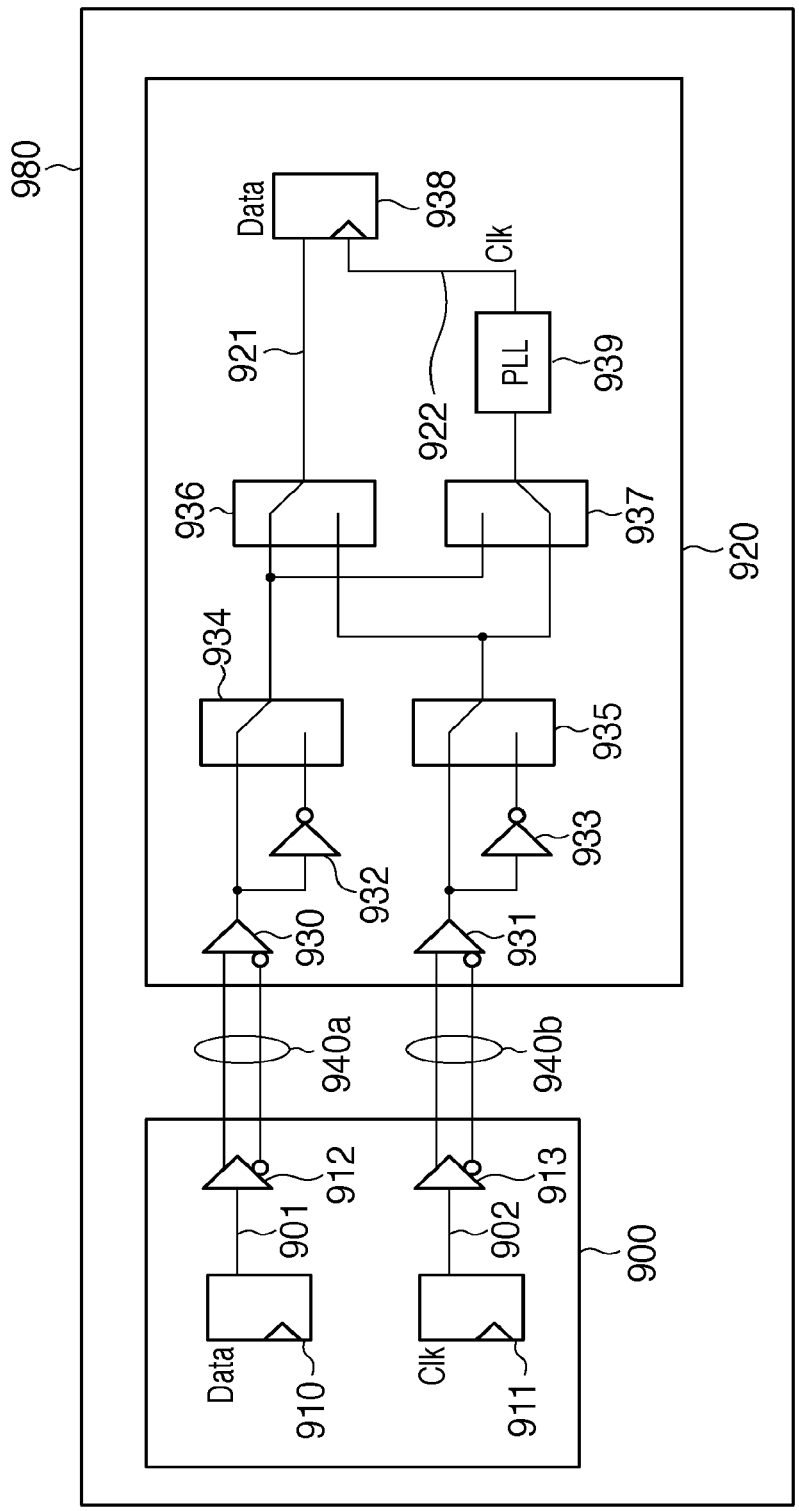
FIG. 9 shows a board configuration in the case where a differential transmission circuit of a fourth embodiment is implemented on the same surface of a board.

FIG. 9 shows a configuration of a differential transmission circuit board of the fourth embodiment.

In FIG. 9, reference numeral 900 denotes a sending unit that sends differential signals. Reference numeral 920 denotes a receiver that receives the differential signals sent by the sending unit 900. Reference numerals 940a and 940b denote transmission paths (first transmission paths, second transmission paths) for transferring the differential signals. Reference numerals 901 and 902 denote input signals (first input signal, second input signal) for generating the differential signals. Reference numerals 910 and 911 denote flip-flop circuits for respectively holding the Data and Clk input signals 901 and 902. Reference numerals 912 and 913 denote buffers for respectively generating differential signals (first differential signals, second differential signals) from the input signals 901 and 902. Reference numerals 930 and 931 denote buffers for respectively receiving the differential signals sent via the transmission paths 940a and 940b, and outputting differences (first difference signal, second difference signal). Reference numerals 932 and 933 denote inverters for respectively inverting the polarities of the signals from the buffers 930 and 931. Reference numeral 934 denotes a selector (first selector) that selects one of the signal from the buffer 930 and the signal from the inverter 932. Reference numeral 935 denotes a selector (second selector) that selects one of the signal from the buffer 931 and the signal from the inverter 933. Reference numerals 936 and 937 denote selectors (third selector, fourth selector) that respectively select one of the signal from the selector 934 and the signal from the selector 935 as a third signal and a fourth signal. Reference numeral 921 denotes an output signal generated by the selector 936. Reference numeral 922 denotes an output signal obtained by doubling the frequency of the signal from the selector 937. Reference numeral 938 denotes a flip-flop circuit for holding the output signal 921. Reference numeral 939 denotes a PLL (Phase Locked Loop) circuit for multiplying the signal frequency.

Here, the case where the sending unit and the receiver are implemented on the same surface of the board will be described.

Figure 10:
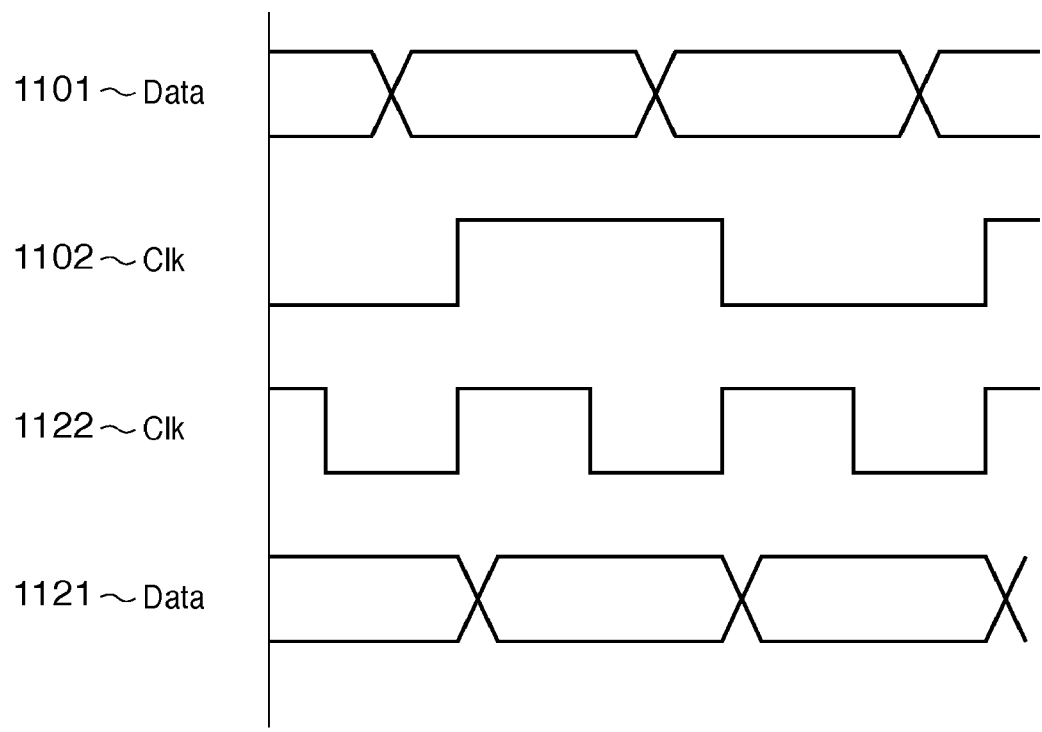
FIG. 10 shows signal waveforms obtained by a differential transmission circuit of the fourth embodiment.

Differential signals are generated by the buffers 912 and 913 from the input signals 901 and 902 and sent to the receiver 920 via the transmission paths 940a and 940b. The selectors 934 and 935 select the signals generated by the buffers 930 and 931 from the received differential signals. The selector 936 selects the signal from the selector 934, and the selector 937 selects the signal from the selector 935. The output signal 921 from the selector 936 is held in the flip-flop circuit 938, and the frequency of the output signal 922 from the selector 937 is doubled by the PPL circuit 939. The waveforms thereby obtained are shown in FIG. 10. Reference numerals 1001 and 1002 respectively denote the Data signal and the Clk signal to be sent. Reference numeral 1022 denotes a Clk signal obtained as a result of the frequency of the received Clk signal being doubled by the PPL circuit. Reference numeral 1021 denotes the received Data signal.

Figure 11:
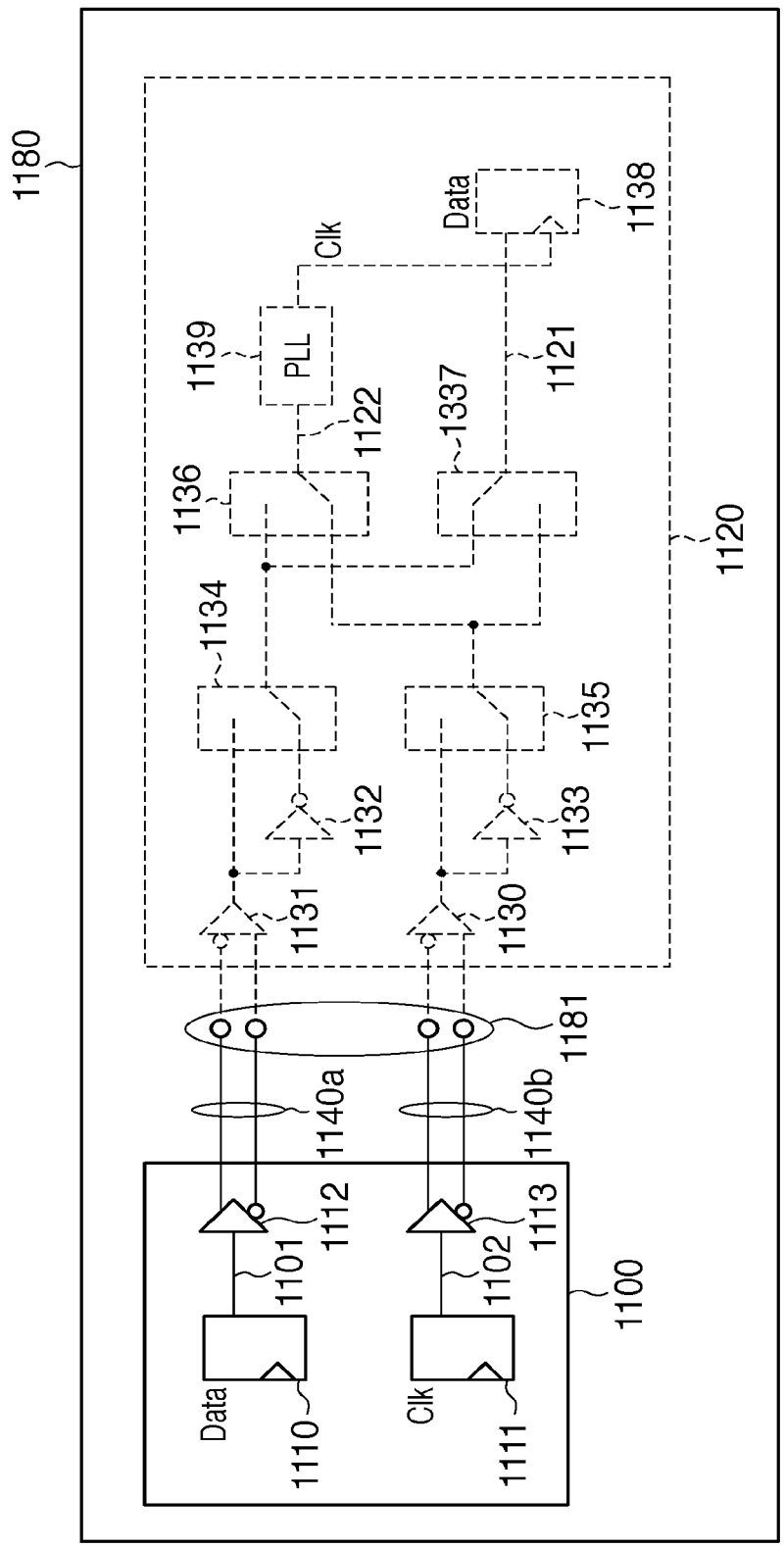
FIG. 11 shows a board configuration in the case where a differential transmission circuit of the fourth embodiment is implemented on different surfaces of a board.

The appearance of a circuit board when the sending unit and the receiver are implemented on different surfaces of the board is shown in FIG. 11.

In FIG. 11, reference numeral 1180 denotes a circuit board, and 1181 denotes via holes. In this case, the polarities of buffers 1130 and 1131 are switched in order to keep both transmission paths 1140a and 1140b parallel and isometric. Differential signals are generated by buffers 1112 and 1113 from input signals 1101 and 1102, and sent to a receiver 1120 via the transmission paths 1140a and 1140b. Selectors 1134 and 1135 respectively select signals generated by buffers 1131 and 1130 from received differential signals and polarity inverted in inverters 1132 and 1133. The Data signal and the Clk signal are then switched as a result of a selector 1136 selecting the signal from the selector 1135, and a selector 1137 selecting the signal from the selector 1134. Output signals 1122 and 1121 from the selectors 1136 and 1137 are the same output signals as when the sending unit and the receiver are implemented on the same surface, with the output signal 1121 being held in the flip-flop circuit 1138, and the frequency of the output signal 1122 being doubled by the PLL circuit 1139. Note that while the case where the transmission signals are a single Data signal and Clk signal has been described, the present invention is also applicable in the case where two or more Data signals and Clk signals are transmitted.

According to the present embodiment, a differential transmission circuit that is compatible in the case where the sending unit and the receiver are implemented either on the same surface or on different surfaces of a board with IC chips having the same terminal arrangement can be realized when transmitting a plurality of signals that include a clock signal using a differential transmission system. This differential transmission circuit is also compatible with board area reduction and device miniaturization.

Fifth Embodiment

As mentioned with FIG. 8, a mechanism for adjusting a clock that clocks an upstream flip-flop is required in the sending unit in order to synchronize the output timing, in the case where one of a plurality of input signals is a clock signal.

Figure 12:
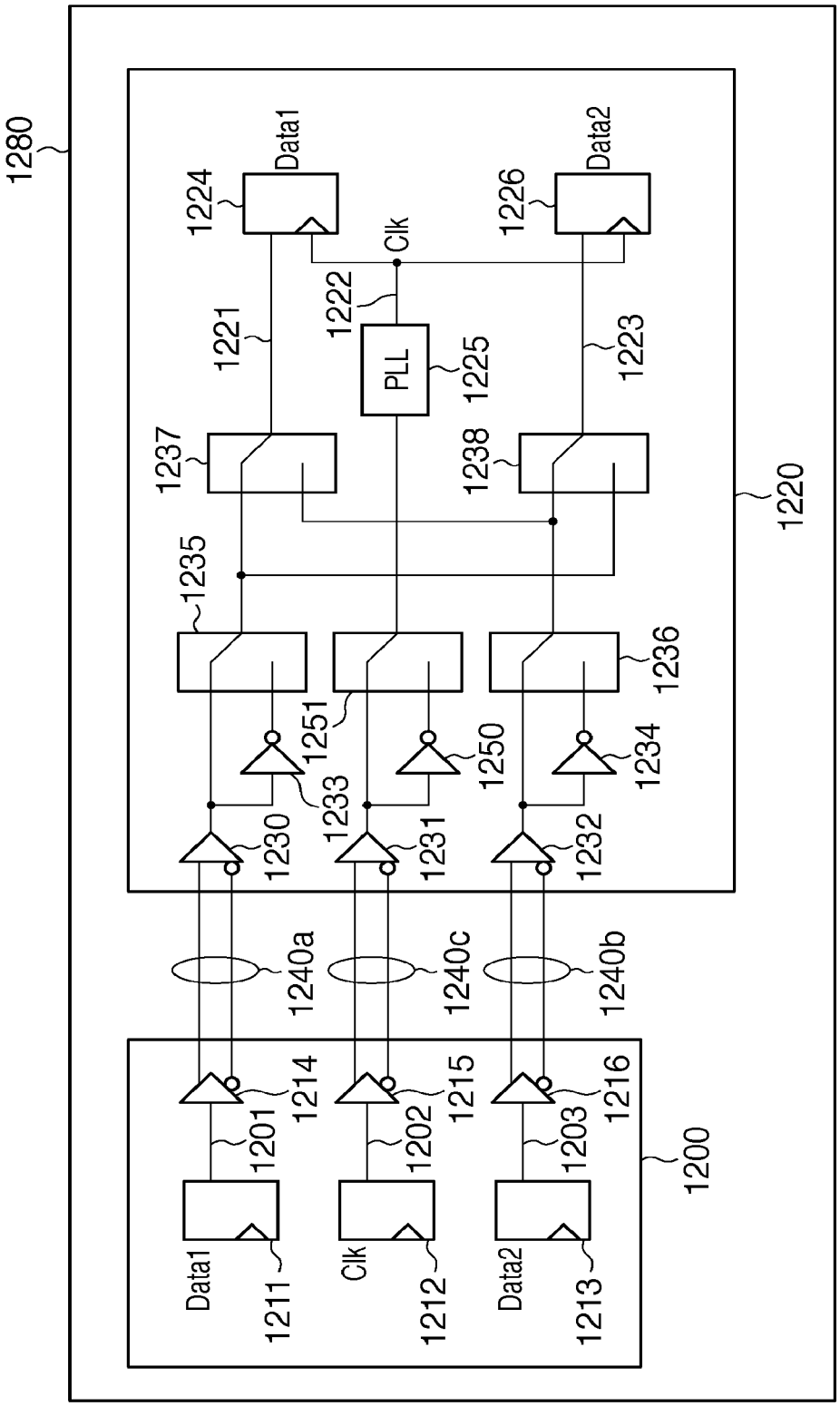
FIG. 12 shows a board configuration in the case where a differential transmission circuit of a fifth embodiment is implemented on the same surface of a board.

FIG. 12 shows, as a fifth embodiment, a configuration of a differential transmission circuit board in which data signals are switched so as to have axisymmetry with reference to a clock signal, in the case where an even number of data signals are sent with respect to a single clock signal.

In FIG. 12, reference numeral 1200 denotes a sending unit that sends differential signals, and 1220 denotes a receiver that receives the differential signals sent by the sending unit 1200. Reference numerals 1240a, 1240c and 1240b denote transmission paths (first transmission paths, third transmission paths, second transmission paths) for transferring all of the differential signals. Reference numerals 1201, 1202 and 1203 denote input signals (first input signal, third input signal, second input signal) for generating the differential signals. Reference numerals 1211, 1212 and 1213 denote flip-flop circuits for respectively holding the Data1, Clk and Data2 input signals 1201, 1202 and 1203. Reference numerals 1214, 1215 and 1216 denote buffers for respectively generating the differential signals (first differential signals, third differential signals, second differential signals) from the input signals 1201, 1202 and 1203. Reference numerals 1230, 1231 and 1232 denote buffers that respectively receive the differential signals sent via the transmission paths 1240a, 1240c and 1240b, and output differences (first differential signal, third differential signal, second differential signal). Reference numerals 1233, 1250 and 1234 denote inverters for respectively inverting the polarities of signals from the buffers 1230, 1231 and 1232. Reference numerals 1235, 1251 and 1236 denote selectors (first selector, fifth selector, second selector) for respectively selecting whether to pass the signals from the buffers 1230, 1231 and 1232 through the inverters 1233, 1250 and 1234. Reference numerals 1237 and 1238 denote selectors (third selector, fourth selector) for switching the signals selected by the selectors 1235 and 1236 as necessary. Reference numerals 1221 and 1223 respectively denote output signals generated by the selectors 1237 and 1238, and 1222 denotes an output signal obtained by doubling the frequency of the signal from the selector 1251. Reference numerals 1224 and 1226 denote flip-flop circuits for respectively holding the output signals 1221 and 1223. Reference numeral 1225 denotes a PLL (Phase Locked Loop) circuit for multiplying the signal frequency.

Next, the case where the sending unit and the receiver are implemented on the same surface of the board will be described.

Differential signals are generated by the buffers 1214, 1215 and 1216 from the input signals 1201, 1202 and 1203 and sent to the receiver 1220 via the transmission paths 1240a, 1240c and 1240b. The selectors 1235 and 1236 select the signals generated by the buffers 1230 and 1232 from the received differential signals, and the selected signals are selected as the output signals 1221 and 1223 by the selectors 1237 and 1238 without being switched. The output signals 1221 and 1223 are respectively held in the flip-flop circuits 1224 and 1226. The frequency of the signal generated by the buffer 1231 from received differential signals and selected by the selector 1251 is multiplied in the PLL circuit 1225, and becomes the clock of the flip-flop circuits 1224 and 1226 as a Clk output signal 1222.

Figure 13:
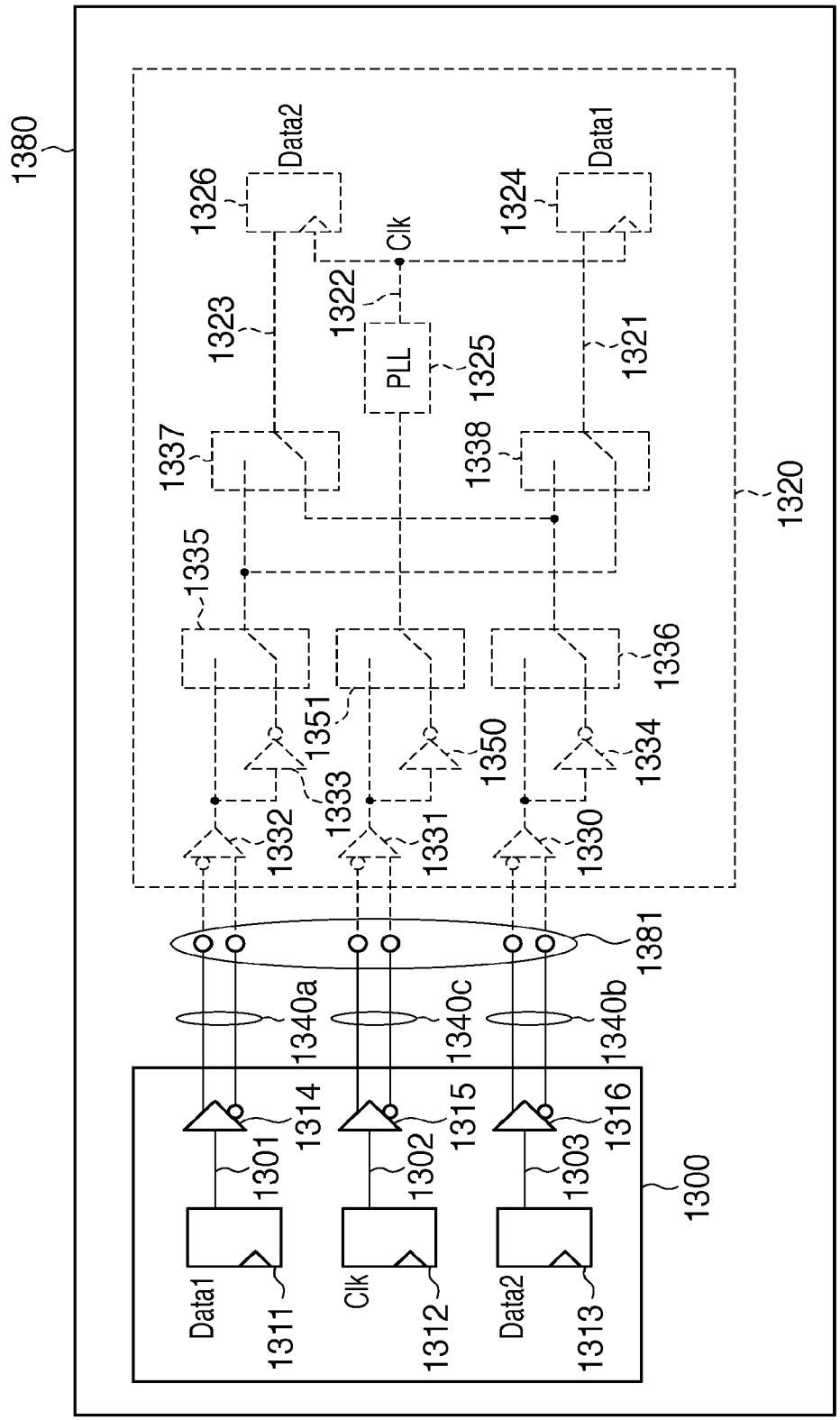
FIG. 13 shows a board configuration in the case where a differential transmission circuit of the fifth embodiment is implemented on different surfaces of a board.
Figure 14:
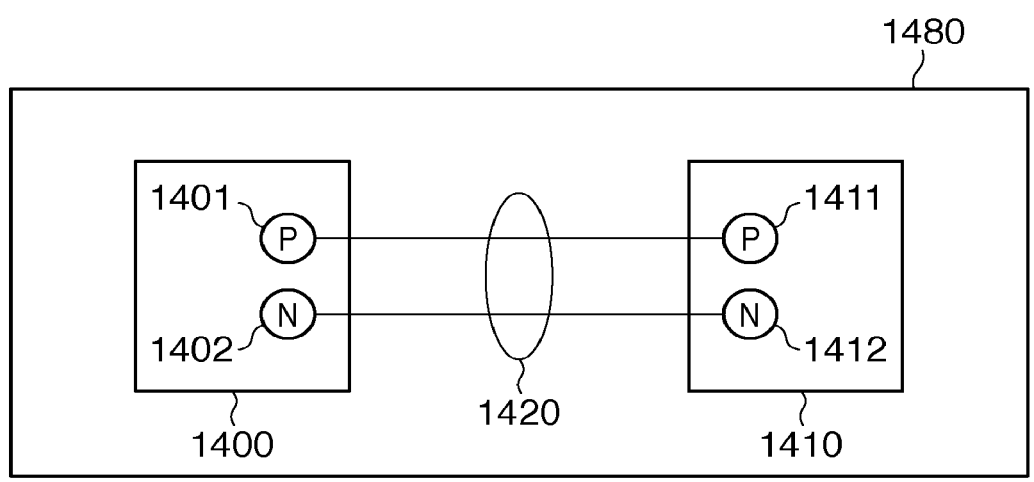
FIG. 14 shows a board configuration in the case where a differential transmission circuit of conventional technology is implemented on the same surface of a board.
Figure 15:
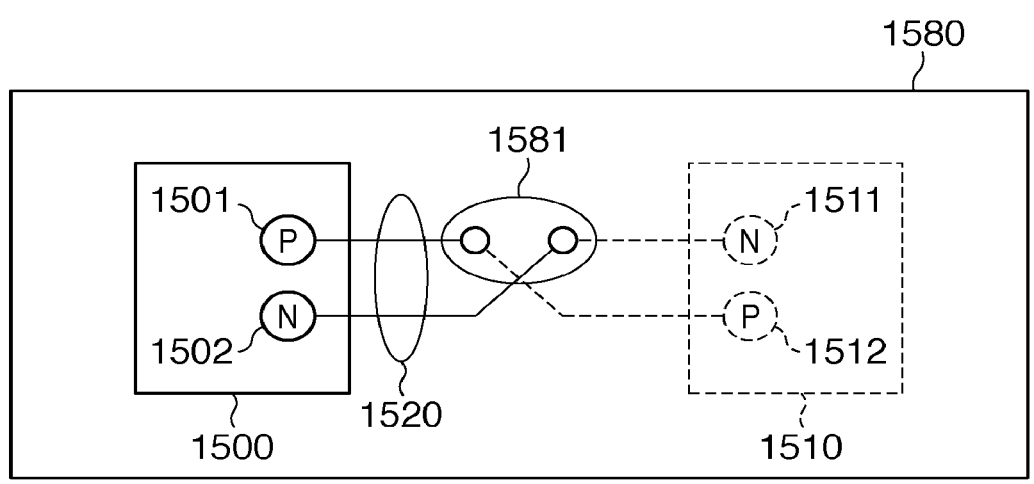
FIG. 15 shows a board configuration in the case where a differential transmission circuit of conventional technology is implemented on different surfaces of a board.
Figure 16:
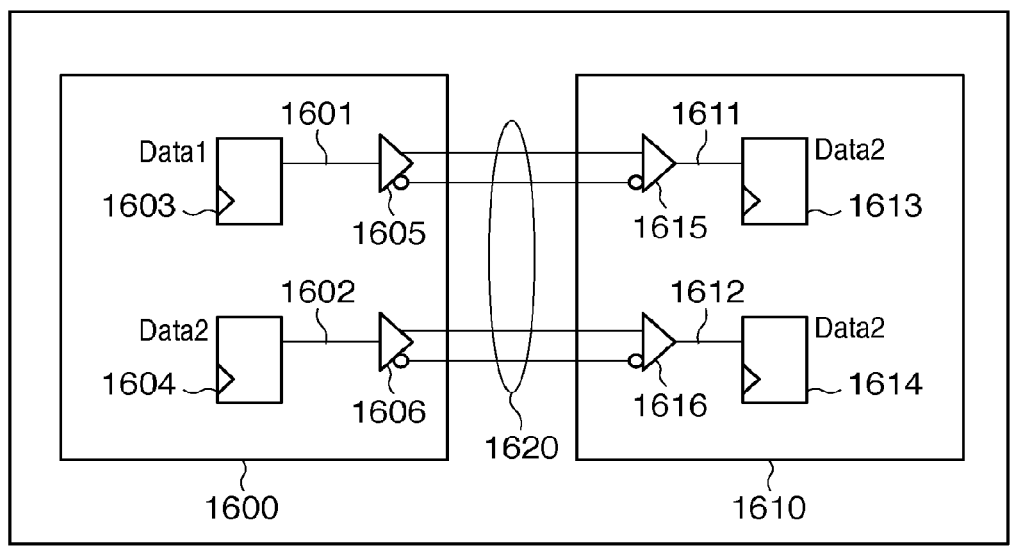
FIG. 16 shows a board configuration in the case where a differential transmission circuit of conventional technology is implemented on the same surface of a board.
Figure 17:
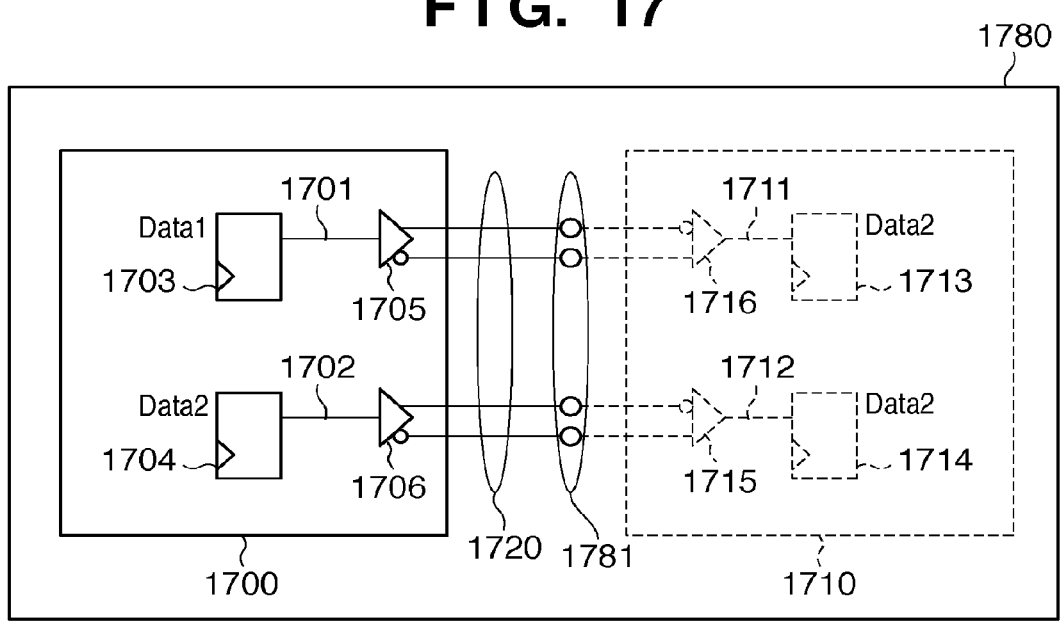
FIG. 17 shows a board configuration in the case where a differential transmission circuit of conventional technology is implemented on different surfaces of a board.
Figure 18:
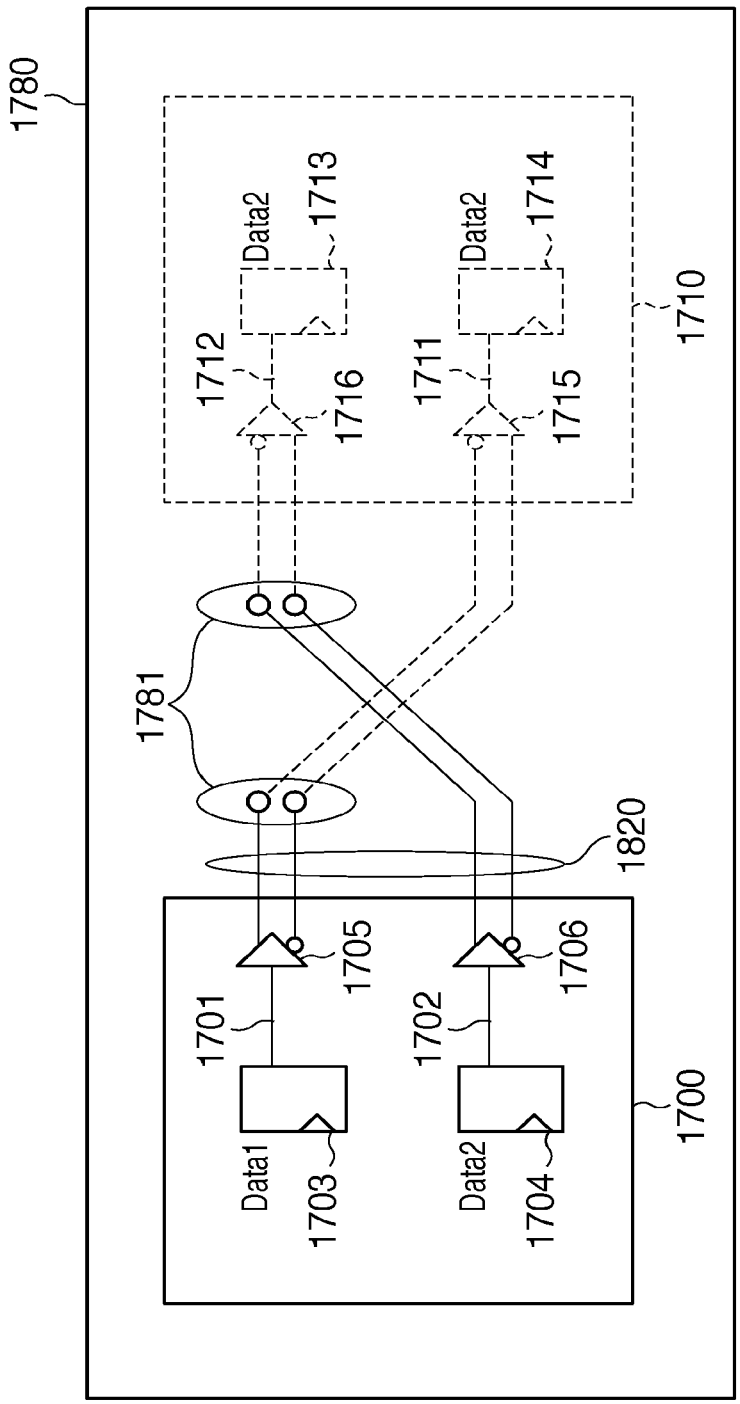
FIG. 18 shows a circuit configuration for preventing signals from being switched around in the differential transmission circuit of FIG. 17.

The appearance of a circuit board when the sending unit and the receiver are implemented on different surfaces of the board is shown in FIG. 13.

In FIG. 13, reference numeral 1380 denotes a circuit board, and 1381 denotes via holes. According to this configuration, the polarities of buffers 1332, 1331 and 1330 are switched in order to keep transmission paths 1340a, 1340c and 1340b parallel and isometric. Differential signals are generated by buffers 1314, 1315 and 1316 from input signals 1301, 1302 and 1303, and sent to a receiver 1320 via the transmission paths 1340a, 1340c and 1340b.

Selectors 1335, 1351 and 1336 respectively select signals generated in buffers 1332, 1331 and 1330 from the differential signals received via the transmission paths 1340a, 1340c and 1340b and polarity inverted in inverters 1333, 1350 and 1334. A selector 1337 selects the signal from the selector 1336, and a selector 1338 selects the signal from the selector 1335, and the selected signals are respectively held in flip-flop circuits 1326 and 1324 as output signals 1323 and 1321. The frequency of the signal generated in the buffer 1331 from the differential signals received via the transmission paths 1340c and selected by the selector 1351 is multiplied in the PLL circuit 1325, and becomes the clock signal of the flip-flop circuits 1324 and 1326 as a Clk output signal 1322.

Here, while the case where two Data signals and a single Clk signal are transmitted from the sending unit and the Data signals are switched in the receiver has been described, the present invention is also applicable in the case where four or more Data signals are transmitted or where the Data signals are switched in the sending unit.

According to the present embodiment, a differential transmission circuit that is compatible in the case where the sending unit and the receiver are implemented either on the same surface or on different surfaces of a board with IC chips having the same terminal arrangement can be realized when transmitting an even number of data signals with respect to a single clock signal using a differential transmission system. This differential transmission circuit is also compatible with board area reduction and device miniaturization.

Sixth Embodiment

Figure 19:
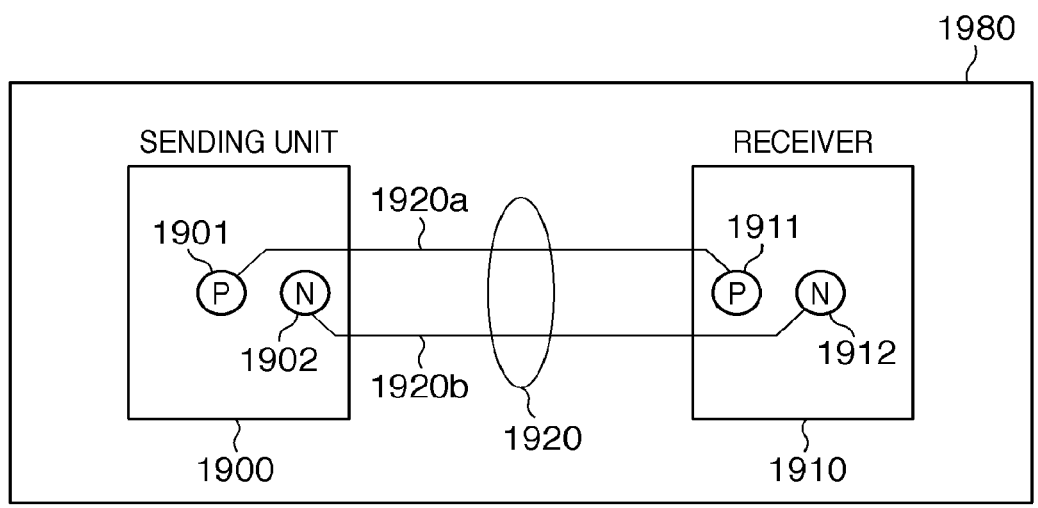
FIG. 19 shows a board configuration in the case where a differential transmission circuit of a sixth embodiment according to the present invention is implemented on the same surface of a board.

FIG. 19 shows a configuration of a differential transmission circuit board of a sixth embodiment according to the present invention. In FIG. 19, reference numeral 1900 denotes a sending unit that generates differential signals from a prescribed input signal, and sends the generated differential signals. Reference numeral 1910 denotes a receiver that receives the differential signals sent by the sending unit 1900, and generates an output signal. Reference numerals 1901 and 1902 are respectively a P terminal and an N terminal provided in the sending unit 1900, and reference numerals 1911 and 1912 are respectively a P terminal and an N terminal provided in the receiver 1910. Reference numerals 1920a and 1920b denote a first transmission path and a second transmission path that transfer the differential signals. Reference numeral 1980 denotes a circuit board.

The P terminal 1901 and the N terminal 1902 of the sending unit 1900 and the P terminal 1911 and the N terminal 1912 of the receiver 1910 are thus lined up in the same direction as the first transmission path 1920a and the second transmission path 1920b. That is, a straight line connecting the P terminal 1901 and the N terminal 1902 of the sending unit 1900 and the P terminal 1911 and the N terminal 1912 of the receiver 1910 is parallel to the first transmission path 1920a and the second transmission path 1920b. The transmission paths 1920a and 1920b are bent within the respective packages of the sending unit 1900 and the receiver 1910, so that the transmission paths 1920a and 1920b are kept parallel at a prescribed interval. Note that while the effects of the present invention are obtained even without bending the transmission paths, an extra via hole is needed in this case in order to prevent the transmission paths from coming into contact with one another. Transmission paths are susceptible to the effects of neighboring signals as a result of passing through internal layers of a board, but these drawbacks can be avoided by bending the transmission paths.

Figure 20:
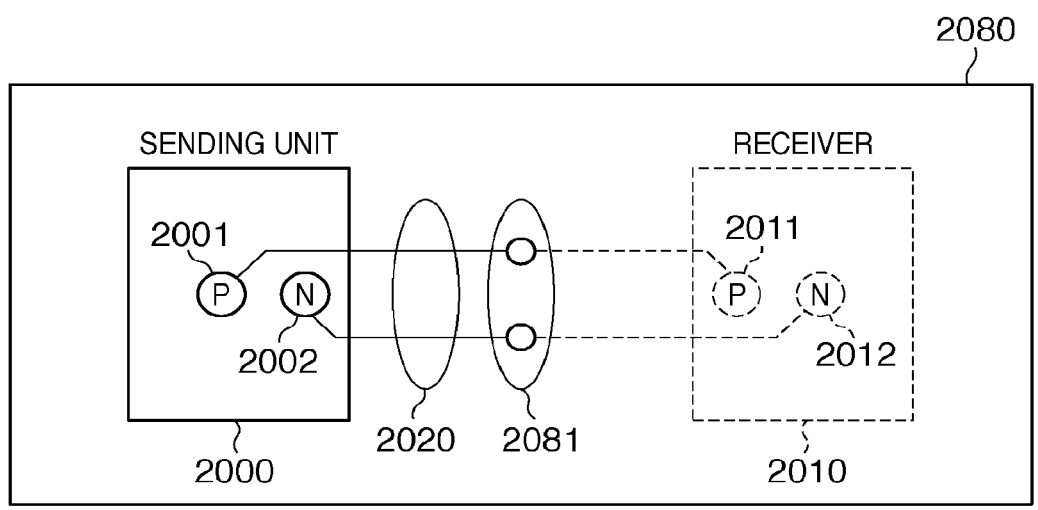
FIG. 20 shows a board configuration in the case where a differential transmission circuit of the sixth embodiment according to the present invention is implemented on different surfaces of a board.

The appearance of a circuit board when a sending unit 2000 and a receiver 2010 are implemented on different surfaces of a board is shown in FIG. 20. In FIG. 20, reference numeral 2080 denotes a circuit board, and 2081 denotes via holes. The dotted lines show that the receiver is implemented on the surface on the opposite side of the board 2080.

A straight line connecting the four terminals, namely, a P terminal 2001 and an N terminal 2002 of the sending unit 2000 and a P terminal 2011 and an N terminal 2012 of the receiver 2010 are parallel to the transmission paths 2020, and also the P terminal 2001 and the N terminal 2002 of the sending unit 2000 and the P terminal 2011 and the N terminal 2012 of the receiver 2010 are lined up equidistant in the same direction, parallel to the transmission paths 2020. The transmission paths thereby do not intersect even in the case where the sending unit 1900 and the receiver 1910 are implemented on the same surface of the board 1980 as shown in FIG. 19, or where the sending unit and the receiver are implemented on different surfaces as shown in FIG. 20. Accordingly, the transmission paths can be kept isometric and parallel, and differential transmission without loss of signal quality is possible.

FIG. 21 shows the case where a P terminal 2101 and an N terminal 2102 of a sending unit 2100 and a P terminal 2111 and an N terminal 2112 of a receiver 2110 are arranged so as to be lined up in different directions, parallel to transmission paths 2120. Reference numeral 2180 denotes a circuit board, and 2181 denotes via holes. The dotted lines show that the receiver is implemented on the surface on the opposite side of a board 2180.

FIG. 22 shows the case where a straight line connecting a P terminal 2201 and an N terminal 2202 of a sending unit 2200 and a straight line connecting a P terminal 2211 and an N terminal 2212 of a receiver 2210 are orthogonal, and a straight line connecting the P terminal and the N terminal of one of the sending unit 2200 and the receiver 2210 is perpendicular with respect to transmission paths 2220. Reference numeral 2280 denotes a circuit board, and 2281 denotes via holes. The dotted lines show that the receiver is implemented on the surface on the opposite side of the board 2280. The transmission paths can be kept parallel in the case of both FIG. 21 and FIG. 22.

Accordingly, a differential transmission circuit board that is compatible in the case where the sending unit and the receiver are implemented either on the same surface or on different surfaces of a board with IC chips having the same pin arrangement can be realized. This differential transmission circuit is also compatible with board area reduction and device miniaturization.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

The invention claimed is:

1. A differential transmission circuit which comprises a terminal from which an input signal is input, terminals to which a pair of differential signals generated from the input signal are output, and a terminal to which an output signal generated from the differential signals is output, wherein the input signal comprises a first input signal and a second input signal, and the differential signals comprise first differential signals and second differential signals, the differential transmission circuit comprising:

a first selector that selects one of the first input signal and a signal obtained by inverting a polarity of the first input signal;

a second selector that selects one of the second input signal and a signal obtained by inverting a polarity of the second input signal;

a third selector that selects, as a third signal, one of the signal selected by the first selector and the signal selected by the second selector;

a fourth selector that selects, as a fourth signal, one of the signal selected by the first selector and the signal selected by the second selector; and a generating unit that generates the first differential signal from the third signal and generates the second differential signals from the fourth signal.

2. A differential transmission circuit which comprises a terminal from which an input signal is input, terminals to which a pair of differential signals generated from the input signal are output, and a terminal to which an output signal generated from the differential signals is output, wherein the input signal comprises a first input signal and a second input signal, the differential signals comprise first differential signals and second differential signals, and the output signal comprises a first output signal and a second output signal, the differential transmission circuit comprising:

a first selector that selects one of a first difference signal obtained by taking a difference of the first differential signals generated from the first input signal, and a signal obtained by inverting a polarity of the first difference signal;

a second selector that selects one of a second difference signal obtained by taking a difference of the second differential signals generated from the second input signal, and a signal obtained by inverting a polarity of the second difference signal;

a third selector that selects one of the signal selected by the first selector and the signal selected by the second selector;

a fourth selector that selects one of the signal selected by the first selector and the signal selected by the second selector; and a generating unit that generates the first output signal from the signal selected by the third selector and generates the second output signal from the signal selected by the fourth selector.

* * * * *